United States Patent [19]
McEwan

[11] Patent Number: 5,517,198
[45] Date of Patent: May 14, 1996

[54] ULTRA-WIDEBAND DIRECTIONAL SAMPLER

[75] Inventor: Thomas E. McEwan, Livermore, Calif.

[73] Assignee: The Regents of the University of California, Oakland, Calif.

[21] Appl. No.: 510,956

[22] Filed: Aug. 3, 1995

Related U.S. Application Data

[63] Continuation-in-part of Ser. No. 301,924, Sep. 6, 1994, which is a continuation-in-part of Ser. No. 44,745, Apr. 12, 1993, Pat. No. 5,345,471.

[51] Int. Cl.$^6$ .................................................. G01S 13/00
[52] U.S. Cl. ................................. 342/89; 375/200
[58] Field of Search ............................. 375/200; 342/89

[56] References Cited

U.S. PATENT DOCUMENTS

| | | | |
|---|---|---|---|
| 5,220,683 | 6/1993 | Rudish | 455/146 |
| 5,345,471 | 9/1994 | McEwan | 375/1 |
| 5,455,593 | 10/1995 | Ross | 342/375 |
| 5,465,094 | 11/1995 | McEwan | 342/28 |

Primary Examiner—J. Woodrow Eldred
Attorney, Agent, or Firm—Henry P. Sartorio

[57] ABSTRACT

The Ultra-Wideband (UWB) Directional Sampler is a four port device that combines the function of a directional coupler with a high speed sampler. Two of the four ports operate at a high sub-nanosecond speed, in "real time", and the other two ports operate at a slow millisecond-speed, in "equivalent time". A signal flowing inbound to either of the high speed ports is sampled and coupled, in equivalent time, to the adjacent equivalent time port while being isolated from the opposite equivalent time port. A primary application is for a time domain reflectometry (TDR) situation where the reflected pulse returns while the outbound pulse is still being transmitted, such as when the reflecting discontinuity is very close to the TDR apparatus.

10 Claims, 3 Drawing Sheets

ULTRA-WIDEBAND DIRECTIONAL SAMPLER

The United States Government has rights in this invention pursuant to Contract No. W-7405-ENG-48 between the United States Department of Energy and the University of California for the operation of Lawrence Livermore National Laboratory.

RELATED APPLICATIONS

This application is a continuation-in-part (CIP) of application Ser. No. 08/301,924 filed Sep. 6, 1994pending, which is a continuation-in-part (CIP) of application Ser. No. 08/044,745 filed Apr. 12, 1993, now U.S. Pat. NO. 5,345,471, which are herein incorporated by reference.

BACKGROUND OF THE INVENTION

Field of the Invention

The invention relates to directional couplers and high speed samplers.

Copending patent application Ser. No. 08/359,090 filed Dec. 19, 1994 describes an electronic material level sensor or "electronic dipstick" based on time domain reflectometry (TDR) of very short electrical pulses. Pulses are propagated along a transmission line or guide wire that is partially immersed in the material being measured. A launcher plate is positioned at the beginning of the guide wire. Reflected pulses are produced at the material interface due to the change in dielectric constant. The time difference of the reflections at the start of the guide wire and at the material interface are used to determine the material level.

However, there is a problem when the reflected pulse returns while the outbound pulse is still being transmitted, i.e. when the reflecting discontinuity is very close to the input or launch end of the transmission line. In these cases it may be necessary to connect the electronics to the transmission line through a cable to sufficiently separate the transmitted and reflected pulses. However, there is a need for a system which does not require a cable wherein the electronics can be connected directly to the launch point of the dipstick.

U.S. Pat. No. 5,345,471 and copending CIP application Ser. No. 08/301,924 filed Sep. 6, 1994 describe an ultra-wideband (UWB) receiver which utilizes a strobed input line with a sampler connected to an amplifier. The outputs of two integrating single-ended samplers are input into a differencing amplifier. The samplers integrate, or average, up to 10,000 pulses.

SUMMARY OF THE INVENTION

Accordingly it is an object of the invention to provide method and apparatus to couple the electronics to a transmission line in a TDR system so that the reflected pulses are separated from the transmitted pulses.

It is another object of the invention to provide an ultra-wideband directional sampler which combines the functions of a directional coupler with a high speed sampler.

The Ultra-Wideband (UWB) Directional Sampler of the invention is a four port device that combines the function of a directional coupler with a high speed sampler. Two of the four ports operate at a high sub-nanosecond speed, in "real time", and the other two ports operate at a slow millisecondspeed, in "equivalent time". A signal flowing inbound to either of the high speed ports is sampled and coupled, in equivalent time, to the adjacent equivalent time port while being isolated from the opposite equivalent time port.

A primary application is for a time domain reflectometry (TDR) situation where the reflected pulse returns while the outbound pulse is still being transmitted, such as when the reflecting discontinuity is very close to the TDR apparatus. In commercial applications of TDR, such as an electronic dipstick for automotive gas tanks, this situation arises when the TDR pulse is launched onto a rod from the top of the tank and the tank is full. In this case, the pulse is reflected back from the gas to the TDR electronics while it is still being transmitted, causing the sampler to sample the transmitted pulse along with the reflected pulse, resulting in a substantial error. The directional sampler isolates the transmitted pulse from the reflected pulse so an accurate level measurement can be made on just the reflected pulse.

The directional sampler is also useful in suppressing close-in clutter in UWB radar systems where the directional sampler is used as a receiver. The directional sampler cancels the transmitted pulse, thereby reducing a major source of radar clutter at close ranges.

DETAILED DESCRIPTION OF THE INVENTION

Figure 1:
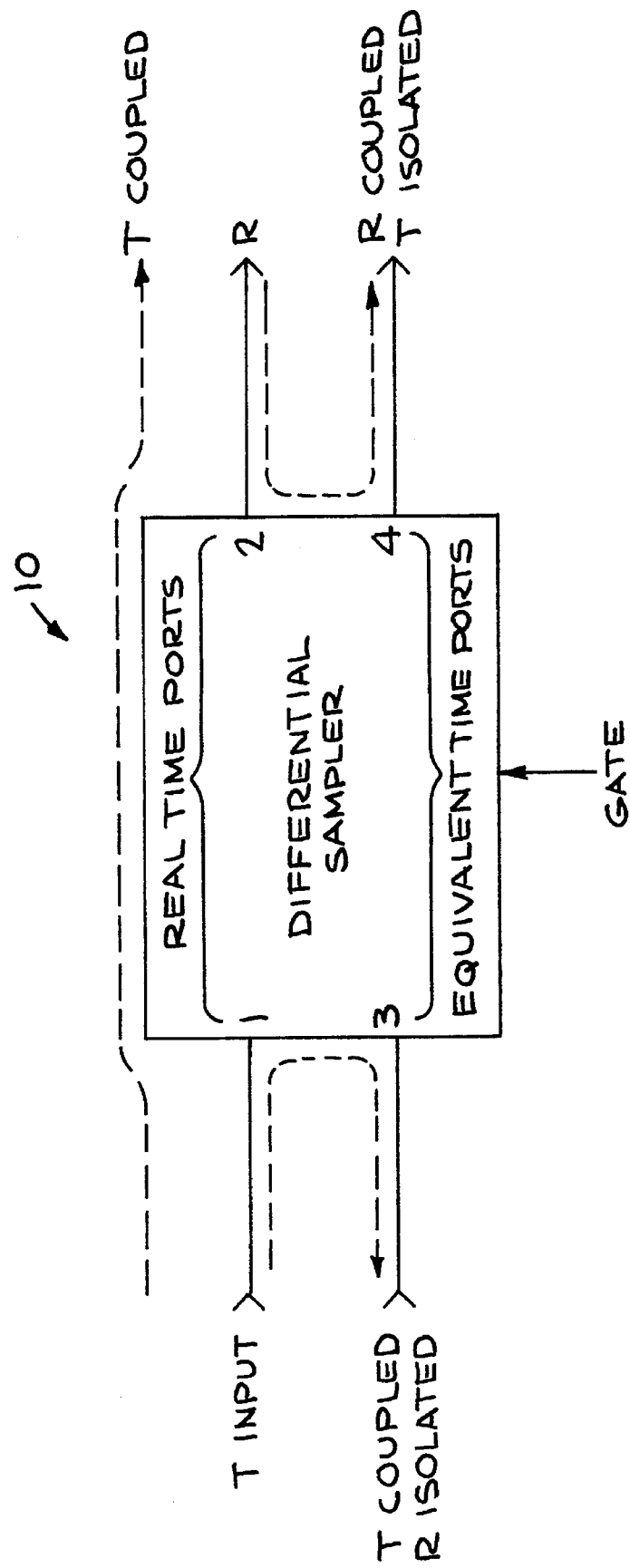
FIG. 1 is a block diagram of the differential sampler.

FIG. 1 depicts the general arrangement of the directional sampler 10. There are four ports where ports 1 and 2 are "real time" ports and ports 3 and 4 are sampled "equivalent time" ports. Ports 1 and 2 are bidirectional regarding signal flow. By convention port 1 is the input port that couples a transmitted signal (T) to port 2. Port 2 is normally connected to an antenna or a transmission line used for TDR purposes. A GATE signal is applied to directional sampler 10 to operate the sampler.

Ports 3 and 4 are output ports from a differential sampler within the coupler, and are not bidirectional. They are outputs only and the outputs are equivalent time replicas of the real time signals at ports 1 and 2.

The signal flow in FIG. 1 shows a transmit input T applied to port 1 that is coupled to port 2 in real time and coupled to port 3 in equivalent time. That is, an equivalent time replica of T appears at port 3. Generally, the real time T input is a 200 picosecond wide pulse that also appears at port 2, and a replica of T appears at port 3 with a pulse width of 200 microseconds.

A portion of the signal T exiting port 2 reflects back as a reflected signal R into port 2. This signal is sampled and appears in equivalent time at port 4 but not at port 3.

Figure 2:
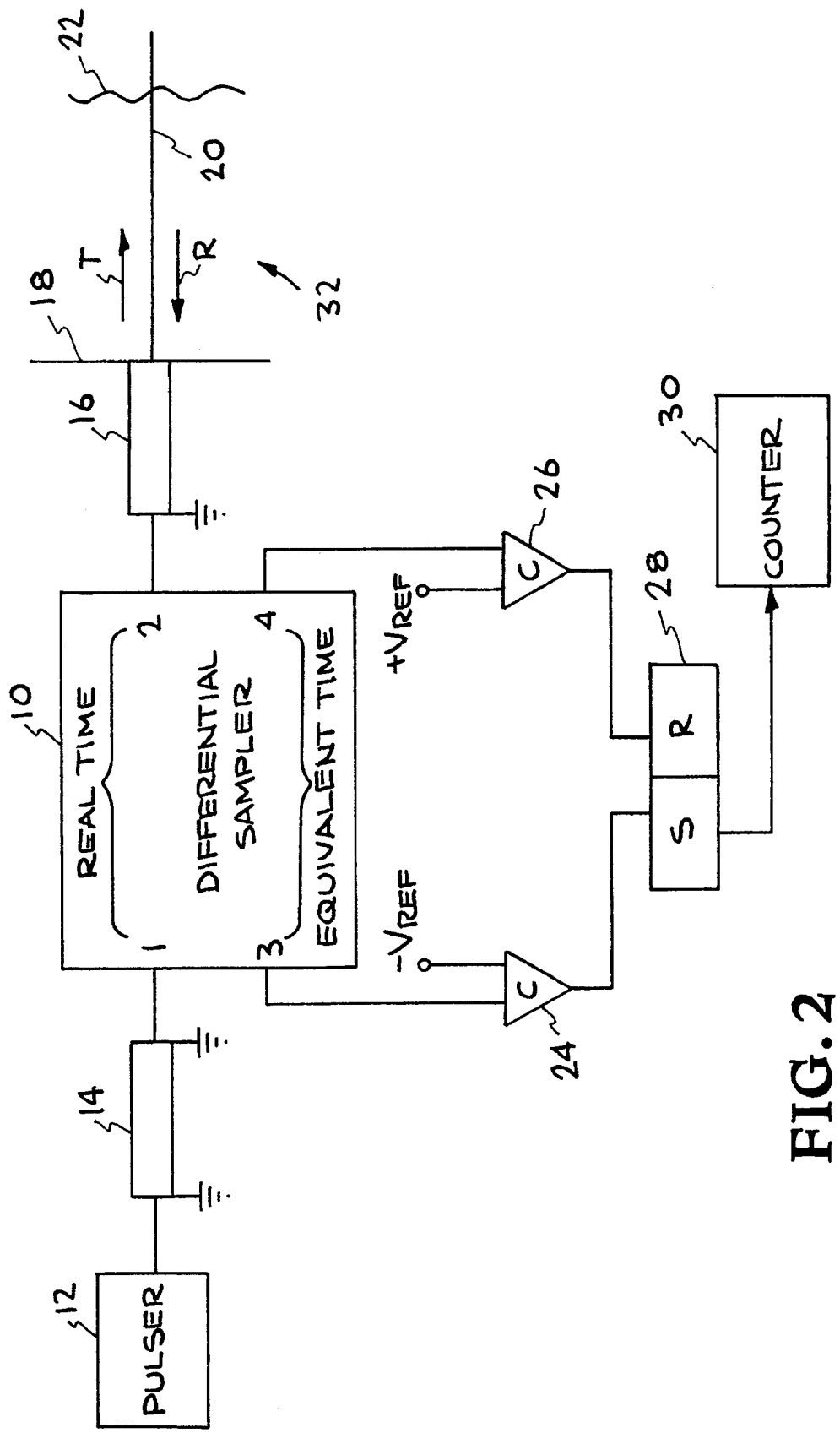
FIG. 2 is a block diagram of a differential sampler connected to a transmission line.

The equivalent time T and R signals are used to gate a range counter, as shown in FIG. 2 where pulser 12 is connected to input port 1 of differential sampler 12 through a transmission line 14. Port 2 of sampler 10 is connected through interconnect cable 16 to transmission line or guide wire ("stick") 20. A launcher plate 18 is mounted at the junction between lines 16 and 20. Transmission line 20 extends into a liquid (or other material) 22. The equivalent time T and R signals at ports 3 and 4 are connected to threshold comparators 24 and 26 that have their reference inputs connected to voltages $-V_{REF}$ and $+V_{REF}$ that are about half the peak amplitudes of the T and R signals, respectively. The comparator 24, 26 outputs drive a flip-flop 28 to generate a variable width range pulse that gates a range counter 30.

The equivalent time range scale is typically 1 ms= 1 inch. If a 1 MHz counter 30 is gated by the range pulse, each count at a 1 microsecond interval corresponds to 0.001". Thus, 0.001" is the level of precision at which the level of fluid 22 can be measured.

Also depicted in FIG. 2 is a typical real time connection of the directional sampler 10, showing illustrative pulses at various points in the circuit, including a 0.2ns pulse generator 12 providing signal T to port 1 and showing T exiting port 2 to a dipstick assembly 32. The dipstick assembly 32 comprises a launcher plate 18 and a metallic guide wire or "stick" 20. The operation of dipstick assembly 32 is described in U.S. patent application Ser. No. 08/359,090 which is herein incorporated by reference. Pulses are reflected from the liquid 22 that the stick 20 is inserted into and provide a reflected signal R back into port 2. An equivalent time replica of R appears at port 4 while an equivalent time replica of T appears at port 3.

In operation, when a signal T of sufficient magnitude, i.e. exceeding $-_{VREF}$, is input into sampler 10 through port 1, and thereby launched into guidewire 20 through port 2, flip-flop 28 is set. When a reflected signal of sufficient magnitude, i.e. exceeding $+V_{REF}$, appears at port 4, flip-flop 28 is reset. Since T can never reach port 4, and R can never reach port 3, the transmit signal T can never reset flip-flop 28 and the reflected signal R can never set flip-flop 28. Thus, even if T and R are very close in time and even overlapping, e.g. when the level of liquid 22 is very near launch plate 18, T and R can only operate on the flip-flop 28 so that the time difference in the reflected signal is accurately measured, giving precise fluid level measurements.

Figure 3:
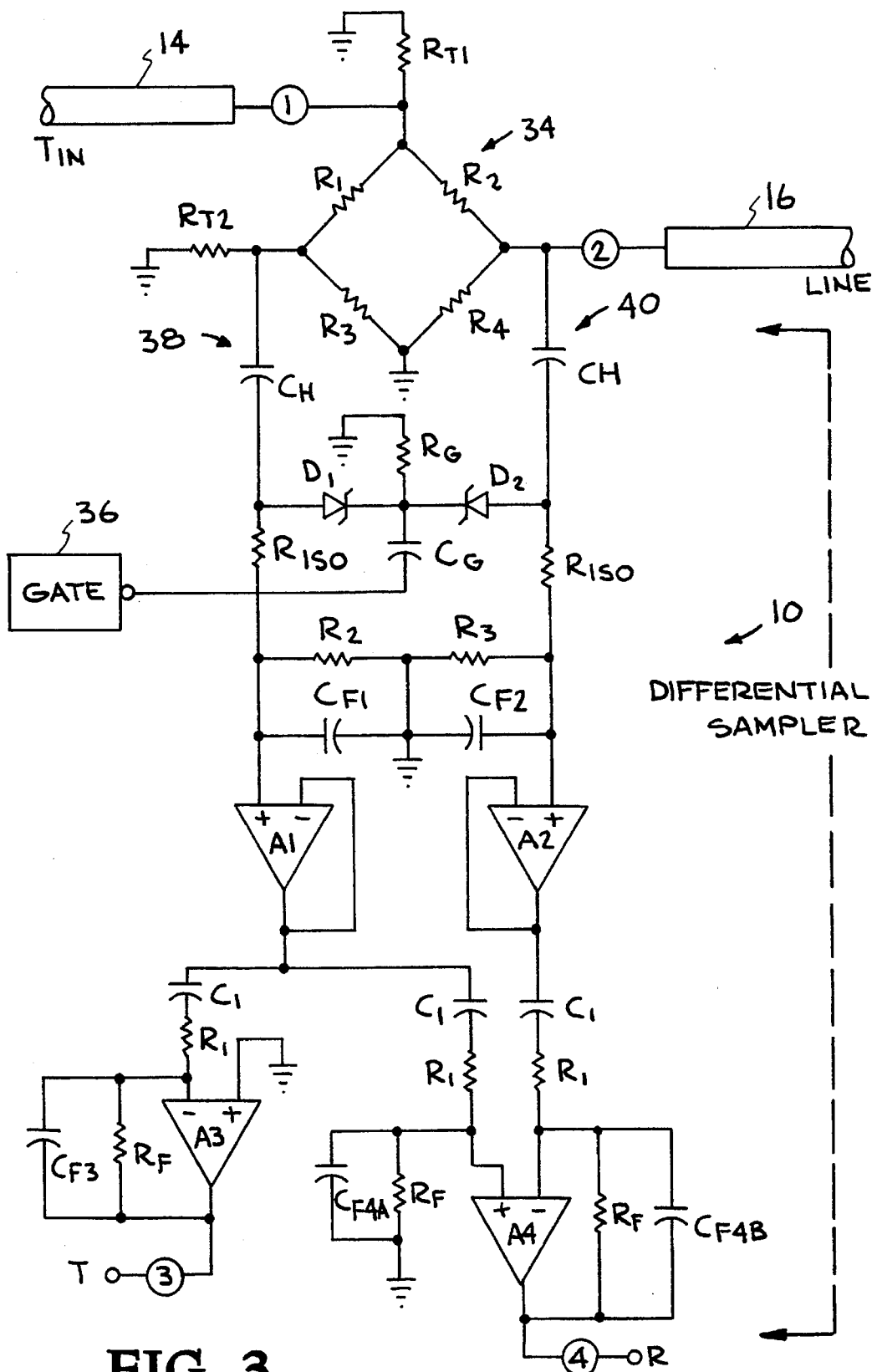
FIG. 3 is a circuit diagram of a differential sampler connected to a transmission line.

FIG. 3 provides a schematic diagram of the directional sampler 10. Input port 1 is terminated by resistor $R_{T1}$ to ground and is further connected to the top of a bridge circuit 34 comprised of resistors $R_1$, $R_2$, $R_3$, $R_4$. Thus input pulse T at port 1 is split by resistors $R_1$, $R_2$ into two channels 38, 40 of differential sampler 10. Port 2 is connected to the right side of the bridge and receives the port 1 signal T through $R_2$. $R_4$, in combination with $R_2$, provides a termination for port 2 that matches the impedance $Z_o$ of the transmission line 16 connected to port 2.

The left side of the bridge is formed by $R_1$ and $R_3$, and is terminated by $R_{T2} = Z_o$. The left and right sides of the bridge are connected to a differential UWB sampler 10 as described in U.S. Pat. No. 5,345,471 and copending CIP application Ser. No. 08/301,924 which are herein incorporated by reference.

A pair of input terminals, one connected to port 2, the other connected to port 1 through $R_1$, are respectively connected through a series capacitor and resistor $C_H$-$R_{ISO}$ to the positive inputs of a pair of differencing (operational) amplifiers A1, A2. The input channels are commonly strobed (GATE) through diodes $D_1$, $D_2$. The strobe line may include a capacitor CG for pulse shaping, if required, and is terminated in a resistor $R_G$. The capacitors $C_H$ act as charge holding capacitor's. The resistors $R_{ISO}$ isolate the strobe pulse from appearing at the amplifier input terminals, and from being shunted to ground by $C_{F1}$, $C_{F2}$. A parallel resistor and capacitor $R_2$—$C_{F1}$, $R_3$—$C_{F2}$ is also connected from each amplifier positive input to ground and act as integrators for voltage developed across $C_H$. The outputs of amplifiers A1, A2 are connected back to the negative inputs of A1, A2. The output of A1, since it is connected to port 1, is the (negative) transmit signal T. The output of A2, since it is connected to port 2, is the (negative) sum of both the transmit signal T and the reflected signal R. The values of the resistances $R_1$–$R_4$ in the bridge 34 are chosen so that R cannot couple back to A1.

The outputs of amplifiers A1, A2 are input through series capacitor $C_i$ and resistor $R_i$ into the positive and negative inputs, respectively, of differencing amplifier A4, whose output at port 4 is R. The negative input of A4 is also connected to its output through parallel $R_F$–$C_{F4B}$ while the positive input of A4 is connected to ground through parallel $R_F$– $C_{F4A}$. The output of A1 is input into an inverting amplifier A3 whose output at port 3 is T. The output of A1 passes through series $C_i$, $R_i$ to the negative input of A3 whose positive input is connected to ground. The output of A3 is also connected back to its negative input through parallel $C_{F3}$–$R_F$.

Capacitors CH form signal integrators, i.e., the time constant $R_{T2} \cdot C_H$ is substantially larger than the sampling gate width (GATE) provided by the pulse generator 36, and the discharge time of $C_H$ is larger than the pulse repetition interval (PRI) of the pulse generator. The discharge time of $C_H$ is set by the current provided through $R_2$, $R_3$ connected from the positive inputs of amplifiers A1, A2. $R_2$, $R_3$ have typical values in the megohm range and $C_H$ may typically be 0.01 microfarad, for pulse generator pulse widths of 0.1ns and a PRI of 1 microsecond.

Resistors $R_{ISO}$ isolate the UWB frequencies from amplifiers A1, A2. Their value must be high compared to $R_{T2}$, but not so high that noise performance is degraded. A typical value is 10K ohms. The product of $R_{ISO}$ times the input capacitance of A1, A2 must be high compared to the pulse generator pulse width.

Additionally, capacitors $C_{F1}$, $C_{F2}$ may be placed from the plus inputs of A1, A2 to ground to improve isolation, and to prevent radio frequencies from the UWB inputs from appearing at the amplifiers inputs, which could result in erratic performance. Only detected baseband voltages should appear at the amplifier inputs.

Amplifiers A1, A2, A4 form a standard high input impedance fully differential amplifier. In this embodiment, A1, A2, and A4 are J-FET input operational amplifiers contained on a single chip, part number TLO-74 by Texas Instruments. $C_i$-$R_i$ and $C_{FX}$-$R_{FX}$ (where X= 3, 4A, or 4B) function as differentiators and integrators, respectively, or in combination, as a baseband bandpass filter.

A pair of diodes D1, D2 are connected in series, cathode to cathode, from the junctions between the pairs of $C_H$ and $R_{ISO}$. Pulse generator 36 is connected to the junction between D1 and D2 (through optional $C_G$).

By symmetry, input signal T will appear equally at both inputs (ports 1, 2) to the differential sampler 10. The differential sampler employs operational amplifiers Ai, A2, and A4 to perform a subtraction between its two inputs, and thus T does not appear at port 4 output. However, op amps A1 and A3 are connected in a single ended configuration to the left side of the bridge only and provide a sampled output of signal T to port 3.

Reflected signal R appears at the right side of the bridge and in greatly attenuated form at the left side of the bridge. The right side of the differential sampler samples R and applies the result to port 4. Thus only R and not T appears at port 4.

Signal R is attenuated by two successive dividers R2, $R_{T1}$, and then by $R_1$, $R_{T2}$ before it reaches the left side of the differential sampler. Thus only a very small portion of R appears as leakage at port 3, so the port 3 output substantially contains only signal T.

Typically $R_1 = R_2 = 560$ ohms, $R_3 = R_4 = 56$ ohms, $Z_o = R_{T2} = 50$ ohms and $R_{T1} = 82$ ohms. With these values, the leakage of R into port 3 is about −40dB. The leakage of R can be perfectly canceled if a matching, attenuated portion of A2's output is applied to the plus input of A3. Of course anyone skilled in the art can fine tune these values to achieve a precise match with $Z_o$. It should also be understood that $R_1$–$R_4$ may also be reactances formed by inductors or capacitors.

The gate pulse (GATE) is typically a +5 to 0 volt transition from a logic gate or transistor. The transition is differentiated into a pulse by $R_G$, $C_G$ and applied to the cathodes of Schottky diodes $D_1$, $D_2$, typically Hewleft Packard type HSMS2814. The gate pulse recurs with a typical repetition rate of 2MHz.

With the invention, because ports 3 and 4 of the directional sampler are isolated from each other, and the reflected signal from the material cannot be confused with the transmit signal, the inteconnect cable from port 2 to the dipstick assembly can be eliminated so that the electronics can be connected directly to the dipstickassembly.

Changes and modifications in the specifically described embodiments can be carried out without departing from the scope of the invention which is intended to be limited only by the scope of the appended claims.

The Invention Claimed is:

1. An ultra-wideband (UWB) directional sampler, comprising:

an electronic coupler having a first port operating in real time, a second port operating in real time and coupled to the first port, a third port coupled to the first port and isolated from the second port and providing an equivalent time representation of a signal at the first port, and a fourth port coupled to the second port and providing an equivalent time representation of a signal at the second port;

a sampling gate pulse generator for sampling signals at the first and second ports.

2. The UWB directional sampler of claim 1 wherein the electronic coupler comprises a resistor bridge circuit connected between the first and second ports, a differential sampler having first and second channels connected from the bridge circuit to the fourth port, and an inverting amplifier connected from the first channel to the third port.

3. The UWB directional sampler of claim 2 further comprising a pair of diodes connected together between the first and second channels and connected to the sampling gate pulse generator.

4. The UWB directional sampler of claim 3 wherein each channel comprises a charge holding capacitor in series with an isolation resistor connected to an input of a differencing amplifier, the output of the differencing amplifier being connected back to a second input.

5. The UWB directional sampler of claim 3 further comprising a third differencing amplifier having an input connected to the output of the differencing amplifier in the first and second channels through a differentiating capacitor and series resistor.

6. Apparatus for measuring the level of a material, comprising:

a pulse generator for generating a real time transmit pulse;

a directional sampler having a first port for receiving the real time transmit pulse, a second port coupled to the first port for transmitting the real time transmit pulse, a third port coupled to the first port and isolated from the second port, and a fourth port coupled to the second port;

a dipstick assembly connected to the second port;

first and second comparators connected to the third and fourth ports;

a set-reset flip-flop connected to the first and second comparators.

7. The apparatus of claim 6 wherein the third and fourth ports of the directional sampler are equivalent time ports.

8. The apparatus of claim 6 wherein the dipstick assembly comprises a guide wire for partial immersion in the material, and a launcher plate at the beginning of the guide wire.

9. The apparatus of claim 6 further comprising an interconnect cable between the second port and the dipstick assembly.

10. The apparatus of claim 6 further comprising a range counter connected to the output of the flip-flop.

* * * * *